(12) United States Patent
Morooka et al.

(10) Patent No.: US 8,148,795 B2
(45) Date of Patent: Apr. 3, 2012

(54) FUNCTIONAL DEVICE

(75) Inventors: Masahiro Morooka, Kanagawa (JP); Yusuke Suzuki, Kanagawa (JP); Reiko Ogura, Kanagawa (JP)

(73) Assignee: Sony Corporation, Tokyo (JP)

( * ) Notice: Subject to any disclaimer, the term of this patent is extended or adjusted under 35 U.S.C. 154(b) by 188 days.

(21) Appl. No.: 11/653,642

(22) Filed: Jan. 16, 2007

(65) Prior Publication Data

US 2007/0284761 A1 Dec. 13, 2007

(30) Foreign Application Priority Data

Jan. 19, 2006 (JP) ................................. 2006-011212

(51) Int. Cl.
*H01L 31/0232* (2006.01)
*H01L 27/14* (2006.01)

(52) U.S. Cl. ........ 257/433; 257/434; 257/431; 257/414; 257/E21.002; 257/E25.007; 136/206; 136/243; 136/251; 136/252

(58) Field of Classification Search .................. 257/792, 257/787, 788, 790, 796, E31.119, E31.11, 257/E27.134, E25.009, 21, 53, 414, 430, 257/431, E25.007, E27.123–126, 428, 433, 257/434, E21.002; 136/251, 256, 263, 249, 136/206, 243, 252; 359/265; 429/317; 438/80
See application file for complete search history.

(56) References Cited

U.S. PATENT DOCUMENTS

| | | | | |
|---|---|---|---|---|
| 4,361,950 A * | 12/1982 | Amick | .............................. | 438/98 |
| 4,428,110 A * | 1/1984 | Kim | ................................. | 438/80 |
| 4,517,403 A * | 5/1985 | Morel et al. | ................... | 136/249 |
| 4,640,744 A * | 2/1987 | Howe | ............................. | 205/687 |
| 4,724,011 A * | 2/1988 | Turner et al. | ................... | 136/249 |
| 5,658,723 A * | 8/1997 | Oberhardt | .......................... | 435/4 |
| 6,291,763 B1* | 9/2001 | Nakamura | ...................... | 136/256 |
| 2002/0038664 A1* | 4/2002 | Zenko et al. | .................... | 136/251 |
| 2002/0122987 A1* | 9/2002 | Tamura et al. | ................. | 429/317 |
| 2002/0134426 A1* | 9/2002 | Chiba et al. | .................... | 136/263 |
| 2003/0155004 A1* | 8/2003 | Takahashi et al. | ............. | 136/263 |
| 2004/0221888 A1* | 11/2004 | Fukui et al. | ..................... | 136/263 |
| 2005/0109385 A1* | 5/2005 | Kim et al. | ....................... | 136/252 |
| 2005/0183769 A1* | 8/2005 | Nakagawa et al. | ............ | 136/263 |
| 2005/0189014 A1* | 9/2005 | Gaudiana et al. | .............. | 136/256 |
| 2005/0194040 A1* | 9/2005 | Hirose | ........................... | 136/263 |
| 2007/0002422 A1* | 1/2007 | O'Shaughnessy | ............ | 359/265 |

FOREIGN PATENT DOCUMENTS

| | | | |
|---|---|---|---|
| JP | 62-119750 | * | 6/1987 |
| JP | 2003-331935 | * | 11/2003 |
| JP | 2004-311385 | | 11/2004 |

* cited by examiner

*Primary Examiner* — Colleen Matthews
*Assistant Examiner* — Galina Yushina
(74) *Attorney, Agent, or Firm* — Wolf, Greenfield & Sacks, P.C.

(57) ABSTRACT

A functional device includes plural substrates, an encapsulant arranged between the plurality of substrates, and a functional material arranged between the plural of substrates and encapsulated with the encapsulant. The functional device further includes an insulating spacer arranged in an entire region where the encapsulant lies, wherein the insulating spacer bonds with the plural substrates through the encapsulant. The encapsulant and the insulating spacer of the functional device allow avoiding a short circuit by providing a constant separation distance between the plural substrates of the functional device and electrodes adjacent to the plural substrates. The insulating spacer is made of a material that is inert to the functional material.

18 Claims, 8 Drawing Sheets

FUNCTIONAL DEVICE

CROSS REFERENCE TO RELATED APPLICATIONS

The present invention contains subject matter related to Japanese Patent Application JP 2006-011212 filed in the Japanese Patent Office on Jan. 19, 2006, the entire contents of which being incorporated herein by reference.

BACKGROUND OF THE INVENTION

1. Field of the Invention

The present invention relates to functional devices suitable as, for example, dye-sensitized solar cells.

2. Description of the Related Art

Functional devices include wet devices (wet elements) typified by dye-sensitized solar cells. The lifetimes of such functional devices as wet devices significantly vary depending on sealing or encapsulating techniques.

Figure 9A:
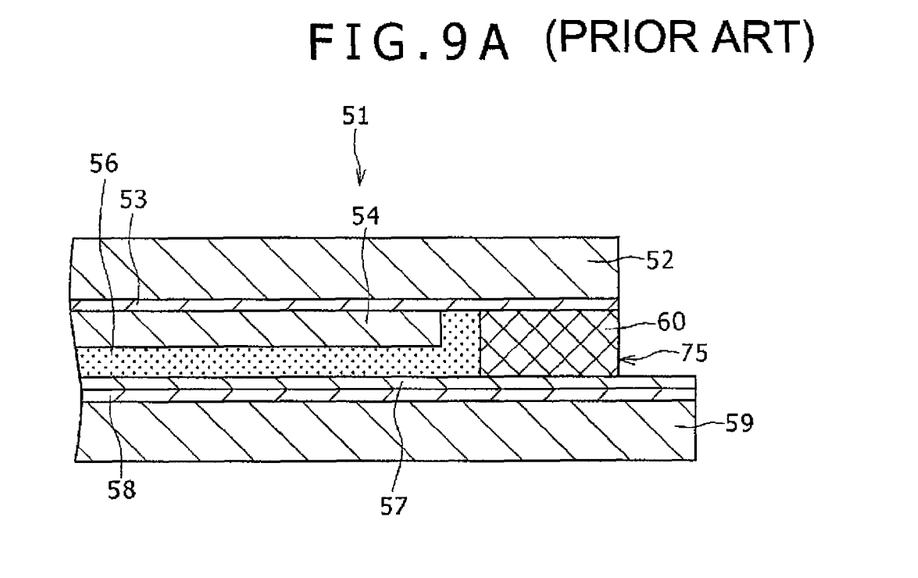
FIGS. 9A and 9B are a partial cross-sectional view of a wet device (dye-sensitized solar cell) and a cross-sectional view of an organic electroluminescent (EL) device, respectively, in related art.

FIG. 9A shows a dye-sensitized solar cell as a wet device. The dye-sensitized solar cell 51 has an assemblage structure including a substrate 52, a transparent conductive layer (fluorine-doped tin oxide (FTO)) 53, a porous, dye-sensitized fine semiconductor particle layer 54, an electrolyte layer 56, a metal layer 57 serving as a counter electrode, a transparent conductive layer (FTO) 58, and a substrate 59 arranged in this order from a light-incoming surface.

In the wet device 51, a liquid such as an electrolyte composition 56 is charged into and encapsulated in a space between the pair of substrates 52 and 59 facing each other. In most of wet devices of this type, an outer periphery 75 of the device 51 is generally sealed with an encapsulant 60 before the charging, and a liquid is then charged into the device through a filling port (not shown) previously formed.

The encapsulant 60 is used for sealing the outer periphery 75 of the substrate 52 and 59. The encapsulant 60 generally includes a heat-sealable film, a liquid adhesive resin, or a glass frit. The substrates 52 and 59 are sealed and bonded with the encapsulant 60 by curing the encapsulant 60 while maintaining a gap between the substrates, in order to avoid a short-circuit between the electrodes.

Figure 9B:
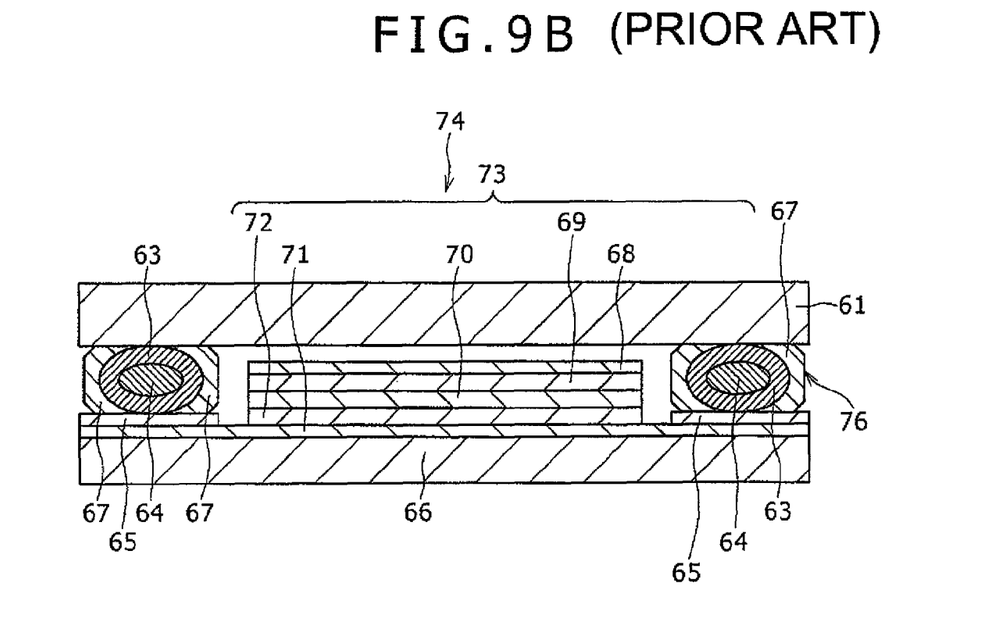

With reference to FIG. 9B, there is proposed an organic electroluminescent (EL) device 73 including a dry device 74 having another enclosure structure (Japanese Unexamined Patent Application Publication (JP-A) No. 2004-311385).

The dry device 74 includes substrates 66 and 61 vertically facing each other. The substrate 66 includes the organic electroluminescent (EL) device 73. The device 73 contains an upper electrode 68, a hole transport layer 69, a luminescent layer 70, an electron transport layer 72, and a lower electrode 71. An outer periphery 76 of the substrates 66 and 61 is sealed with an enclosure structure. The enclosure structure includes a core 64, a metal layer 63, an adhesive layer 67, and an insulating film 65.

The enclosure structure includes a strip member and an adhesive layer 67. The strip member includes the elastic strip core 64 and the metal layer 63 covering at least part of the core 64. The enclosure structure serves to bond between the substrates 61 and 66 so as to constitute the dry device 74. The dry device 74 contains the substrates 61 and 66, and a functional device including the organic electroluminescent (EL) device 73 encapsulated between the substrates 61 and 66.

SUMMARY OF THE INVENTION

However, the wet device 51 shown in FIG. 9A may have a varying thickness of the encapsulant 60 under some conditions for the formation of the encapsulant 60. Such a varied thickness of the encapsulant 60 may cause the following disadvantages, because the thickness determines the gap between the substrates.

Specifically, the thickness of the encapsulant 60, i.e., gap between the substrates 52 and 59, is generally about 10 to about 200 μm. The device tends to be encapsulated insufficiently with an increasing gap, because the encapsulant 60 has an increasing sectional area and an electrolytic solution penetrates at an increasing rate with an increasing gap. The device may therefore be encapsulated more satisfactorily by reducing the gap between the substrates. In the enclosure structure in related art, however, it is difficult for the encapsulant layer to have a thickness, i.e., the gap between the substrates, less than the total thickness of two electrodes (an anode and a cathode).

When the encapsulant 60 has a small thickness, the gap between the substrates 52 and 59 is small. In this case, the fine semiconductor particle layer 54 and the metal layer 57 arranged on the substrates 52 and 59, respectively, may come in contact with each other vertically, and this may cause a short circuit between the two electrodes.

In contrast, the dry device 74 shown in FIG. 9B uses the electroconductive metal layer 63 in its enclosure structure. Accordingly, when the dry device 74 has electrodes arranged adjacent to the substrates 61 and 66, respectively, as in the wet device 51, the two electrodes may come in contact with each other through the metal layer 63, and this may cause a short circuit between the two electrodes.

Under these circumstances, it is desirable to provide a functional device which is satisfactorily encapsulated or sealed, rarely invites a short circuit, and is suitable not only as a dry device but also as a wet device.

Specifically, one embodiment of the present invention relates to a functional device which includes a plurality of substrates, an encapsulant arranged between the plurality of substrates, and a functional material arranged between the plurality of substrates and encapsulated with the encapsulant. The functional device further includes an insulating spacer arranged in an entire region where the encapsulant lies, and the insulating spacer bonds with the plurality of substrates through the encapsulant.

A device according to the embodiment of the present invention is resistant to a short circuit between the substrates. This is because an insulating spacer is arranged in an entire region where the encapsulant lies, the substrates can thereby easily have a gap between them held constant and can be easily electrically insulated from each other.

The insulating spacer also serves to reduce the amount of the encapsulant, preferably, to a minimum amount. Such a reduced amount of the encapsulant may act to suppress the penetration typically of an electrolytic solution. Accordingly, even when the device is applied to a wet device, the resulting device can be satisfactorily encapsulated.

BRIEF DESCRIPTION OF THE DRAWINGS

Embodiments of the present invention will be described in detail based on the following figures, wherein.

DESCRIPTION OF THE PREFERRED EMBODIMENTS

A device according to an embodiment of the present invention preferably has an enclosure structure between the substrates, which enclosure structure includes at least three layers containing the encapsulant, the spacer, and the encapsulant arranged in this order. By satisfying this, the gap between the substrates can be easily held constant, and the encapsulant can have a minimized cross-sectional area. Accordingly, even when the functional material is liquid such as an electrolytic solution, the penetration of the functional material may be suppressed, and the resulting device can be more satisfactorily encapsulated.

The functional material may include a liquid composition. In this case, the spacer is preferably inert to a solvent constituting the composition and satisfactorily acts as a barrier to the solvent. In this case, the shape of the spacer can be further satisfactorily maintained.

The spacer preferably includes at least one selected from inorganic materials such as glass, quartz, alumina, and zirconia; and organic materials such as polyethylenes, polypropylenes, poly(ethylene terephthalate)s, poly(ethylene naphthalate)s, poly(phenylene sulfide)s, and polyimides.

The encapsulant preferably includes at least one material selected from, for example, acrylic resins, epoxy resins, polyisobutylenes, urethane resins, silicone resins, ionomer resins, polyolefins and glass frits.

The functional device may further include electrodes extending to edges of the plurality of substrates, respectively, in an electrode lead-out section, and have an enclosure structure including the spacer and the encapsulant, in which edges of the electrodes may overlap each other at least partially so as to attach the enclosure structure by sandwiching. The electrode lead-out section is configured to lead the electrodes out of the functional device. In this case, the spacer may act more effectively to prevent a short circuit between the two electrodes.

The functional device is preferably so configured that the functional material includes a liquid electrolyte composition, and outer peripheries of the substrates are sealed. In this case, it is preferably used as a dye-sensitized solar cell.

Preferred embodiments of the present invention will be illustrated in detail below with reference to the attached drawings.

A wet device 1 (functional device) such as a dye-sensitized solar cell according to an embodiment will be illustrated with reference to FIGS. 1A, 1B, 1C, 2, and 3.

The dye-sensitized solar cell 1 has an assemblage including a substrate 2, a transparent conductive layer (fluorine-doped tinoxide; FTO) 3, a porous and dye-sensitized fine semiconductor particle layer 4, an electrolyte layer 6 (liquid functional material), a metal layer 7 serving as a counter electrode, a transparent conductive layer (FTO) 8, and a substrate 9 arranged in this order from a light-incoming surface.

The fine semiconductor particle layer 4 and the metal layer 7 are arranged with a predetermined spacing (gap) so as to face each other in a vertical direction with the interposition of the electrolyte layer 6. In this state, the two substrates 2 and 9 bond with each other at their outer peripheries through an encapsulant, and the electrolyte layer 6 is thus encapsulated therebetween. A liquid electrolyte composition for constituting the electrolyte layer 6 is charged into a gap between the substrates 2 and 9 from a filling port (not shown) arranged in the substrate 9.

Figure 1A:
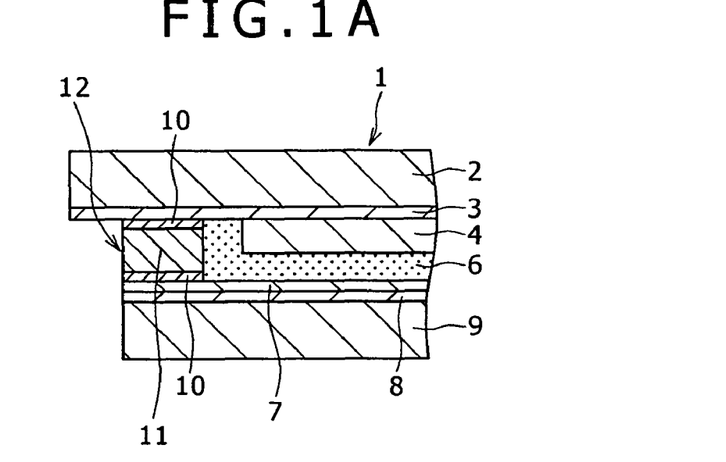
FIGS. 1A, 1B, and 1C are cross-sectional views of a wet device (dye-sensitized solar cell) according to an embodiment of the present invention, taken along with the lines A-A' in FIG. 3.
Figure 1B:
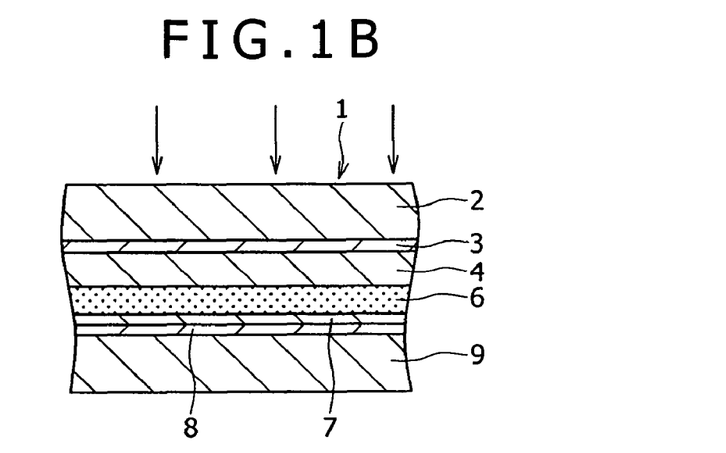
Figure 1C:
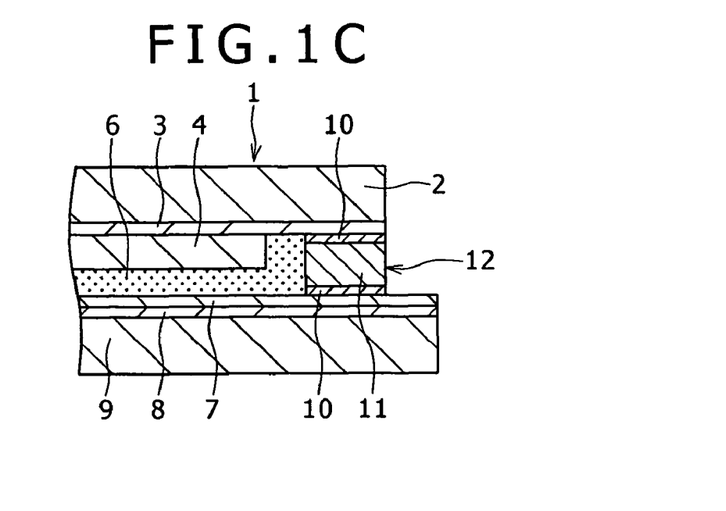
Figure 2:
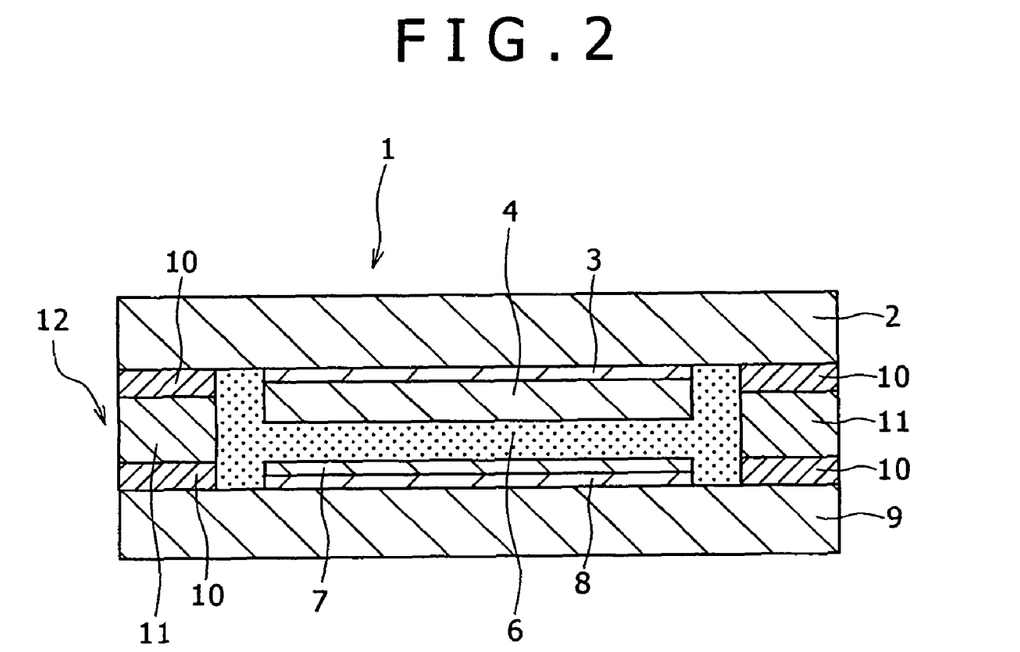
FIG. 2 is a cross-sectional view of the wet device taken along with the lines B-B' in FIG. 3.
Figure 3:
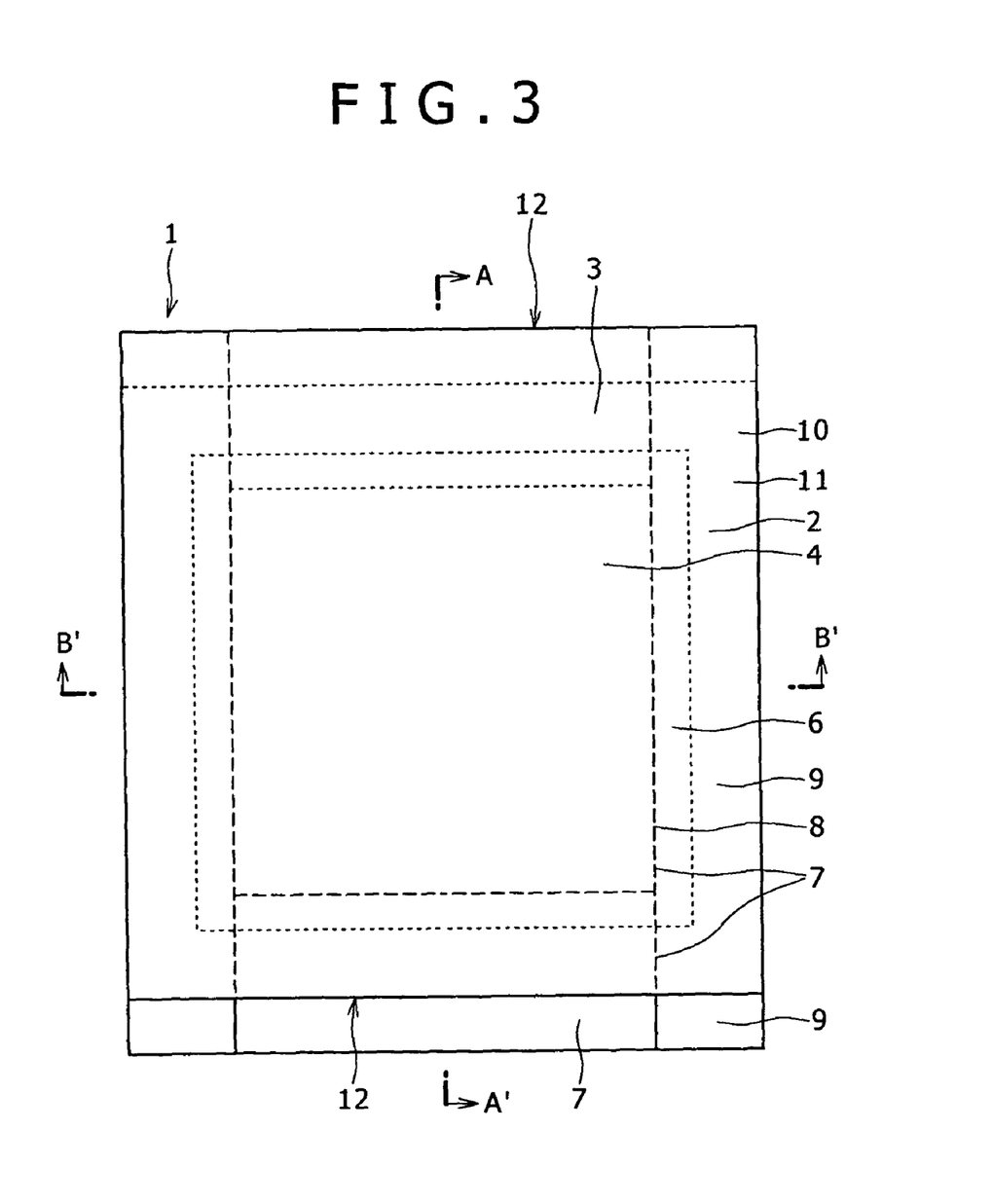
FIG. 3 is a plan view of the wet device.

With reference to FIGS. 1A and 1C, an enclosure structure in an outer periphery 12 of the substrates 2 and 9 includes three layers vertically arranged. The enclosure structure includes an encapsulant 10, an insulating spacer 11, and an encapsulant 10. The transparent conductive layers 3 and 8 extend to edges of the substrates in opposed two sides of the outer periphery 12.

By the action of the enclosure structure including the insulating spacer 11 as an intermediate layer, the substrates 2 and 9 easily have a constant gap between them and are easily electrically insulated from each other. In particular, a short circuit between the two electrodes 3 and 8, i.e., between the substrates 2 and 9 can be suppressed.

In the dye-sensitized solar cell 51 in related art shown in FIG. 9A, the thickness of the encapsulant 60 is equal to the gap between the substrates 52 and 59. The gap is generally about 10 to about 200 μm. The encapsulant 60 has an increasing sectional area, and an electrolytic solution in the electrolyte layer 56 tends to penetrate at an increasing rate as the gap increases.

Accordingly, the encapsulation performance may be improved if the gap between the substrates 52 and 59 is reduced so as to reduce the cross-sectional area of the encapsulant 60 and to reduce the rate of penetration of the electrolytic solution in the electrolyte layer 56. In the enclosure structure in related art, however, it is difficult for the encapsulant 60 to have a thickness defining the gap between the substrates 52 and 59 less than the total thickness of two electrodes (the anode and the cathode).

According to this embodiment, however, the enclosure structure at the substrate outer periphery 12 has a three layer structure including the encapsulant 10, the insulating spacer 11, and the encapsulant 10 (FIGS. 1A, 1B, 1C, and 2). By satisfying this, the cross-sectional area of the encapsulant 10 can be minimized so as to avoid disadvantages caused by penetration of the electrolytic solution, and the device can be markedly satisfactorily encapsulated.

The presence of the spacer 11 contributes to more easy maintenance of the gap between the two substrates constant and uniform. More specifically the gap between the fine semiconductor particle layer 4 and the metal layer 7 can be maintained constant and uniform. In addition, oxidation-reduction reactions in the wet device 1 can be carried out homogenously, and the wet device 1 can have stabilized performance.

Next, components of the dye-sensitized solar cell 1 will be illustrated in detail below.

Spacer

The thickness of the insulating spacer 11 for use in an enclosure structure can be set freely but is preferably, for example, about 5 μm to about 200 μm. The ratio of the thickness of the spacer 11 to that of the encapsulant 10 is preferably about 1:4.5 to about 1:0.0005.

The gap between the substrates 2 and 9 may increase and the electrolyte layer 6 may have an increased resistance if the thickness of the spacer 11 is excessively large. The resulting device may be handled not satisfactorily, if the thickness is excessively small. If the thickness of the spacer 11 is equal to or less than the total thickness of the anode 4, and the cathodes 7 and 8, the encapsulant 10 should have an increased thickness so as to prevent a short circuit between the anode 4 and the cathode 7. Consequently, the spacer 11 more preferably has a thickness of 100 μm or less and equal to or less than the total thickness of the electrode 4 (e.g., titanium oxide electrode) and the counter electrode 7 as determined from the surfaces of the substrates 2 and 9, respectively.

The spacer 11 may include any material, as long as it is inert to and has high barrier properties to an organic solvent. Preferred materials include inorganic materials such as glass, quartz, alumina, and zirconia; and organic materials such as polyethylenes, polypropylenes, poly(ethylene terephthalate)s, poly(ethylene naphthalate)s, poly(phenylene sulfide)s, and polyimides.

Encapsulant

The encapsulant 10 serves to bond between the spacer 11 and the substrates 2 and 9, respectively. A material for the encapsulant 10 is not specifically limited, but is preferably a material which is resistant to permeation of an electrolytic solution. Such preferred materials include acrylic resins, epoxy resins, polyisobutylenes, urethane resins, silicone resins, ionomer resins, polyolefins and glass frits. The thickness of the encapsulant 10 can be set arbitrarily but is preferably small so as to prevent the permeation of an electrolytic solution. Specifically, the thickness is preferably about 0.1 to about 50 μm.

Transparent Conductive Layer

The surface electrical resistance of the transparent conductive layers 3 and 8 is preferably minimized, and is preferably 500 $\Omega/cm^2$ or less, and more preferably 100 $\Omega/cm^2$ or less. Materials for constituting the transparent conductive layers 3 and 8 are not specifically limited and include, but are not limited to, indium-tin multicomponent oxide (ITO), fluorine-doped $SnO_2$ (FTO), antimony-doped $SnO_2$ (ATO), and $SnO_2$. Each of such materials can be used alone or in combination. These layers may carry interconnections of, for example, electrically conductive metals or carbon, so as to reduce the surface electrical resistance and improve the current collection efficiency.

Substrate

Materials for the transparent substrates 2 and 9 are not specifically limited, as long as they are optically transparent. Such materials are preferably those which are resistant to penetration of water and gas from the outside of the wet device, are resistant against solvents, and have excellent weather resistance.

Specific examples of materials for the substrates include, but are not limited to, transparent inorganic materials such as quartz, sapphire, and glass; and transparent plastic materials such as poly(ethyleneterephthalate)s, poly(ethylene naphthalate)s, polycarbonates, polystyrenes, polyethylenes, polypropylenes, poly(phenylene sulfide)s, poly(vinylidene fluoride)s, tetraacetylcellulose, brominated phenoxy resins, aramid resins, polyimides, polystyrenes, polyarylates, polysulfones, and polyolefins. Among them, materials having high transmittance in the visible ray region are preferred for the substrates.

According to an embodiment, the substrates undergo a step of carrying out hydrothermal treatment in a basic aqueous solution, and the substrates are therefore preferably those being highly resistant to bases. The thicknesses of the substrates serving as supports are not specifically limited and can be freely selected according to conditions such as the optical transmittance and the barrier properties of the wet device 1 from surroundings.

Fine Semiconductor Particle Layer

Materials for fine semiconductor particles for use in the fine semiconductor particle layer 4 include, for example, silicon and other single-substance semiconductors; compound semiconductors; and compounds having a perovskite structure. These semiconductors are preferably n-type semiconductors in which a conduction-band electron acts as a carrier and gives an anode current upon excitation by light. Specific examples thereof are $TiO_2$, $ZnO$, $WO_3$, $Nb_2O_5$, $TiSrO_3$, and $SnO_2$, of which anatase $TiO_2$ is more preferred.

The fine semiconductor particles are not limited to those listed above. Each of such fine semiconductor particles can be used alone or in combination as a mixture or a compound. The fine semiconductor particles can be used in the form of particles, tubes, and rods, according to necessity.

The fine semiconductor particle layer 4 can be formed by any process, but is preferably formed by wet-forming of a film of fine semiconductor particles, from the viewpoints typically of properties of the resulting layer, easiness and convenience of the process, and production cost. Specifically, the layer 4 is preferably formed by dispersing a powder or sol of fine semiconductor particles in a solvent such as water to yield a paste, and applying the paste to a transparent conductive layer 3 formed on a substrate 2.

The application procedure (coating procedure) herein is not specifically limited and can be selected from various coating procedures such as dipping, spraying, wire bar coating, spin coating, roller coating, blade coating, and gravure coating. Instead of the coating procedure, wet printing can also be employed. The wet printing can be carried out by any procedure such as relief printing, offset printing, gravure printing, intaglio printing, rubber plate printing, or screen printing.

The crystal form of crystalline titanium dioxide ($TiO_2$) is preferably an anatase form for satisfactory photocatalytic activity. Such anatase titanium oxide may be available as commercial products as, for example, a powder, sol, or slurry. It may also be prepared according to a procedure such as hydrolysis of an alkoxide of titanium oxide to yield particles having a predetermined particle diameter.

When a commercially available powder is used, secondary agglomeration of particles is preferably solved by, for example, pulverizing particles typically in a mortar or ball mill upon preparation of a coating composition. In this procedure, an agent may be added for preventing re-agglomeration of particles after solving secondary agglomeration. Such agents include acetylacetone, hydrochloric acid, nitric acid, a surfactant, and a chelating agent. The coating composition may further contain thickeners for increasing the viscosity of the coating composition. Such thickeners include, for example, polymer materials such as poly(ethylene oxide)s and poly(vinyl alcohol)s; and cellulosic thickeners.

The particle diameter of fine semiconductor particles is not specifically limited, but is preferably about 1 to about 200 nm and more preferably about 5 to about 100 nm in terms of average particle diameter of primary particles. A photochemical efficiency (quantum yield) can be improved by further using one or more different particles having diameters larger than those of the fine semiconductor particles and scattering incoming light. In this case, the one or more particles to be additionally used preferably have an average particle diameter of about 20 to about 500 nm.

The fine semiconductor particle layer 4 preferably has a large surface area so as to adsorb a large amount of a dye. Consequently, the surface area of the fine semiconductor particle layer 4 as arranged on the substrate 2 as a support is preferably 10 times or more and more preferably 100 times or more the projected area thereof. The upper limit of the ratio of the surface area to the projected area is not specifically limited, but is generally about 1000 times.

With an increasing thickness of the fine semiconductor particle layer 4, the layer carries an increasing amount of a dye per unit projected area and catches light at an increasing rate. In this case, however, a loss due to recombination of charges increases, because injected electrons disperse to a more extent. Consequently, the thickness of the fine semiconductor particle layer 4 is generally preferably about 0.1 to about 100 µm, more preferably about 1 to about 50 µm, and further more preferably about 3 to about 30 µm.

Fine semiconductor particles are preferably fired so as to establish an electronic contact between particles after applied to the support (substrate) and to thereby allow the layer to have improved strength and adhesion with the substrate 2. The firing is carried out at any temperature not limited but is generally carried out at about 40° C. to about 700° C. and more preferably at about 40° C. to about 650° C. If firing is carried out at excessively high temperatures, the substrate may have an increased resistance and may be melted. A firing time period is not limited but is generally about ten minutes to about ten hours.

After the firing, the fine semiconductor particles may be subjected to a treatment to have an increased surface area and to show increased necking among them. The treatment herein includes, for example, chemical plating using an aqueous titanium tetrachloride solution; a necking treatment using an aqueous titanium trichloride solution; and a dipping treatment in a sol of ultrafine semiconductor particles having a diameter of 10 nm or less.

The term "necking" herein refers to a state in which fine particles fuse and adhere with each other. The term "necking treatment" refers to a treatment for establishing "necking" among fine particles by incorporating other fine particles having smaller particle diameters into the fine particles and then carrying out firing, when the original fine particles have spaces among them and do not establish "necking" among them if the fine particles are simply fired.

When a plastic substrate 2 is used as a support for the transparent conductive layer 3, the layer 4 may be formed by applying a film of a paste including a binder to the substrate 2, and carrying out hot pressing so as to conduct compression bonding of the film to the substrate 2.

Dyes to be supported by the fine semiconductor particle layer 4 are not specifically limited, as long as they have sensitizing actions. Examples of such dyes include, but are not limited to, xanthene dyes such as rhodamine B, rose bengal, eosine, and erythrosine; cyanine dyes such as merocyanine, quinocyanine, and kryptocyanine; basic dyes such as phenosafranine, Capri blue, thiocin, and methylene blue; porphyrin compounds such as chlorophyll, zinc porphyrin, and magnesium porphyrin; azo dyes; phthalocyanine compounds; coumarin compounds; ruthenium-bipyridine complex compounds; ruthenium-terpyridine compounds; anthraquinone dyes; polycyclic quinone dyes; and squarylium dyes. Among them, ruthenium-bipyridine complex compounds are typically preferred for higher photochemical efficiency (quantum yield). Each of these can be used alone or in combination.

A dye can be adsorbed by the fine semiconductor particle layer 4 according to any procedure not limited. A dye may be adsorbed, for example, by dissolving the dye in a solvent, and dipping an electrode carrying the fine semiconductor particle layer 4 in the solution or applying the dye solution to the fine semiconductor particle layer 4. Such solvents include, for example, alcohols, nitrites, nitromethane, halogenated hydrocarbons, ethers, dimethyl sulfoxide, amides, N-methylpyrrolidone, 1,3-dimethylimidazolidinone, 3-methyloxazolidinone, esters, carbonic esters, ketones, hydrocarbons, and water.

The dye solution (dye composition) may further include, for example, deoxycholic acid so as to reduce the association between dye particles. In addition or alternatively, the dye composition may further contain an ultraviolet absorbent.

After the adsorption of a dye, the surface of the fine semiconductor particles may be subjected to a treatment typically with an amine. Examples of the amine include pyridine, 4-tert-butylpyridine and polyvinylpyridines. An amine can be used as intact when it is a liquid or may be dissolved in an organic solvent to yield a solution.

Metal Layer

The metal layer 7 serving as a counter electrode may include any material, as long as it is an electroconductive material. Alternatively, the metal layer 7 may also contain an insulating material, if the insulating material carries an electroconductive layer on a side facing the semiconductor electrode layer 4. The material for the metal layer 7 (electrode) is preferably one which is electrochemically stable, such as platinum, gold, carbon, or an electroconductive polymer.

A surface of the metal layer 7 facing the semiconductor electrode 4 preferably has a fine structure and has a large surface area, for higher redox catalytic activities. For example, platinum, if used, is preferably in the form of platinum black, and carbon, if used, is preferably porous carbon. The platinum black can be prepared, for example, according to anodic oxidation of platinum or a treatment with chloroplatinic acid. The porous carbon can be formed, for example, sintering of carbon fine particles or firing of an organic polymer.

The metal layer 7 can be arranged as a transparent counter electrode 7 by forming an interconnection of a metal having high redox catalytic activities, such as platinum, on a transparent conductive layer 8 or treating the surface of the transparent conductive layer 8 with chloroplatinic acid.

Electrolyte Composition

An electrolyte composition for use in the electrolyte layer 6 can be, for example, a combination of $I_2$ with a metal iodide or an organic iodide; a combination of $Br_2$ with a metal bromide or an organic bromide; metal complexes such as ferrocyanate/ferricyanate, and ferrocene/ferricinium ion; sulfur compounds such as poly(sodium sulfide)s, alkylthiol/alkyl disulfide; viologen dyes; and hydroquinone/quinone system.

Preferred examples of cations for constituting the metal compounds are Li, Na, K, Mg, Ca, and Cs, and preferred examples of cations for constituting the organic compounds are quaternary ammonium compounds such as tetraalkyl ammoniums, pyridiniums, and imidazoliums. However, cations are not limited to those listed above, and each of such cations can be used alone or in combination. Among them, a combination of $I_2$ with LiI, NaI or a quaternary ammonium compound such as imidazolium iodide is preferred as the electrolyte composition.

The concentration of an electrolyte salt is preferably 0.05 M to 5 M, and more preferably 0.2 M to 3 M relative to the solvent. The concentration of $I_2$ or $Br_2$ is preferably 0.0005 M to 1 M and more preferably 0.001 to 0.3 M. The electrolyte composition may further include additives such as 4-tertbutylpyridine and carboxylic acids, for improvements in open-circuit voltage and short-circuit current.

Solvents for constituting the electrolyte composition include, but are not limited to, water, alcohols, ethers, esters, carbonic acid esters, lactones, carboxylic acid esters, phosphate triesters, heterocyclic compounds, nitriles, ketones, amides, nitromethane, halogenated hydrocarbons, dimethyl sulfoxide, sulfolanes, N-methylpyrrolidone, 1,3-dimethylimidazolidinone, 3-methyloxazolidinone, and hydrocarbons. Each of these can be used alone or in combination. The solvent can also be a liquid of a quaternary ammonium salt of tetraalkyl, pyridinium, or imidazolium, which liquid is ionic at room temperature.

The electrolyte composition can be used as a gel electrolyte by dissolving a gelatinizing agent, a polymer, or a crosslinkable monomer in the composition, in order to further reduce the leakage and evaporation of the electrolyte composition from the wet device 1.

The ion conductivity increases but the mechanical strength decreases with an increasing ratio of the electrolyte composition to the gel matrix. In contrast, the mechanical strength increases but the ion conductivity decreases with an excessively decreasing ratio of the electrolyte composition to the gel matrix. Consequently, the amount of the electrolyte composition is preferably 50 percent by weight to 99 percent by weight, and more preferably 80 percent by weight to 97 percent by weight of the gel electrolyte composition.

A solid-state wet device 1 can be constituted by dissolving the electrolyte composition in a polymer with a plasticizer, and removing the plasticizer by evaporation.

A method for preparing a wet device 1 will be illustrated with reference to FIGS. 3, 4A, 4B, and 5.

Preparation Method of Wet Device

Figure 4A:
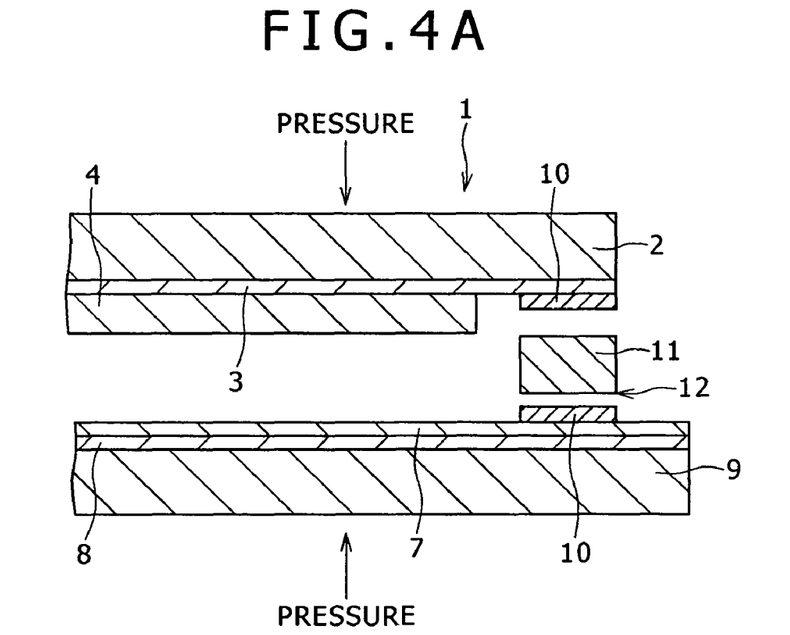
FIGS. 4A and 4B are partial cross-sectional views illustrating two embodiments of the preparation of a wet device.

With reference to FIG. 4A, initially, encapsulants 10 and 10 are attached to outer peripheries 12 of substrates 2 and 9, respectively. A spacer 11 having a rectangular frame shape with a rectangular cross section is arranged between the encapsulant 10 on the substrate 2 and the other encapsulant 10 on the substrate 9. A pressure is then vertically applied to the substrate 2 and the substrate 9 from outside toward inside to yield an enclosure structure at the outer peripheries 12 of the substrates 2 and 9. The enclosure structure has an integrated three-layer structure and includes the spacer 11 having a rectangular frame shape with a rectangular cross section, and the encapsulants 10 and 10 arranged so as to sandwich the spacer 11.

Figure 4B:
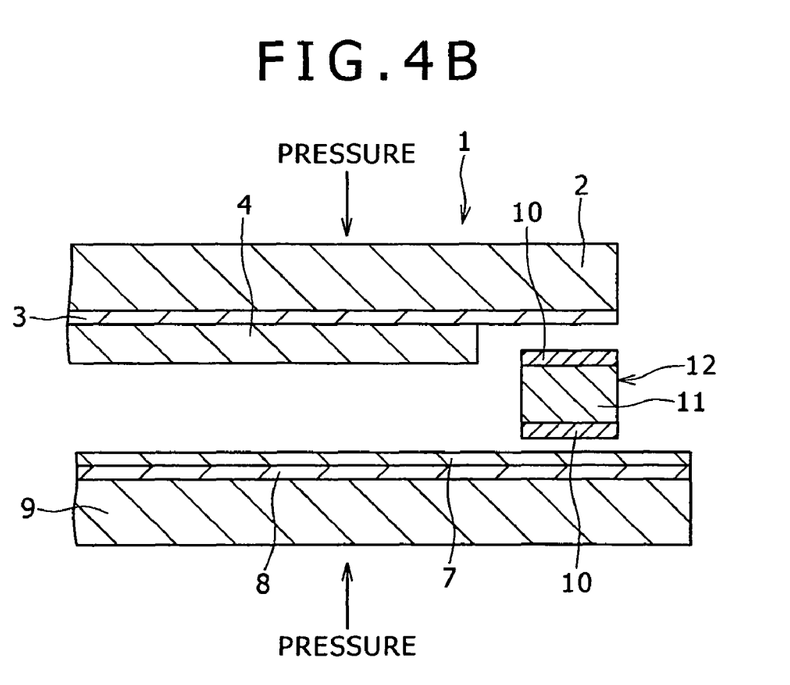

Alternatively, an enclosure structure may be formed at the outer peripheries 12 of the substrates 2 and 9 in the following manner (FIG. 4B). Initially, encapsulants 10 and 10 are placed on an upper side and bottom side of a spacer 11 having a rectangular frame shape with a rectangular cross section. The spacer 11 bearing the encapsulants 10 and 10 is arranged between outer peripheries 12 of the substrates 2 and 9. A pressure is then vertically applied to the substrates 2 and 9 from outside toward inside so as to yield the enclosure structure. The enclosure structure herein also has an integrated three-layer structure and includes the spacer 11 having a rectangular frame shape with a rectangular cross section, and the encapsulants 10 and 10 arranged so as to sandwich the spacer 11.

Figure 5:
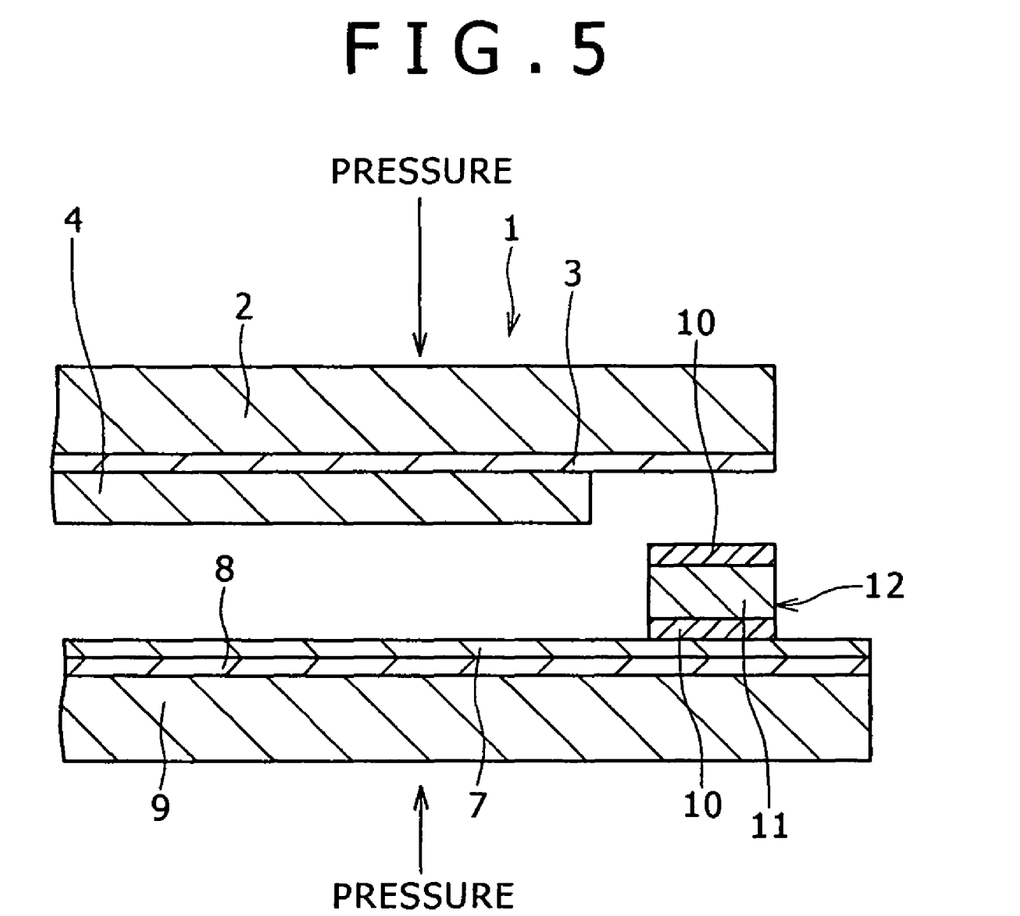
FIG. 5 is a partial cross-sectional views illustrating another embodiment of the preparation of a wet device.

Further alternatively, an enclosure structure may be formed at the outer peripheries 12 of the substrates 2 and 9 in the following manner (FIG. 5). An encapsulant 10, a spacer 11 having a rectangular frame shape with a rectangular cross section, and an encapsulant 10 are attached in this order to an outer periphery 12 of the substrate 9. The substrate 2 is then placed over the substrate 9 so as to cover these components. A pressure is then vertically applied to the substrates 2 and 9 from outside toward inside so as to yield the enclosure structure. The enclosure structure herein also has an integrated three-layer structure and includes the spacer 11 having a rectangular frame shape with a rectangular cross section, and the encapsulants 10 and 10 arranged so as to sandwich the spacer 11.

Figure 6A:
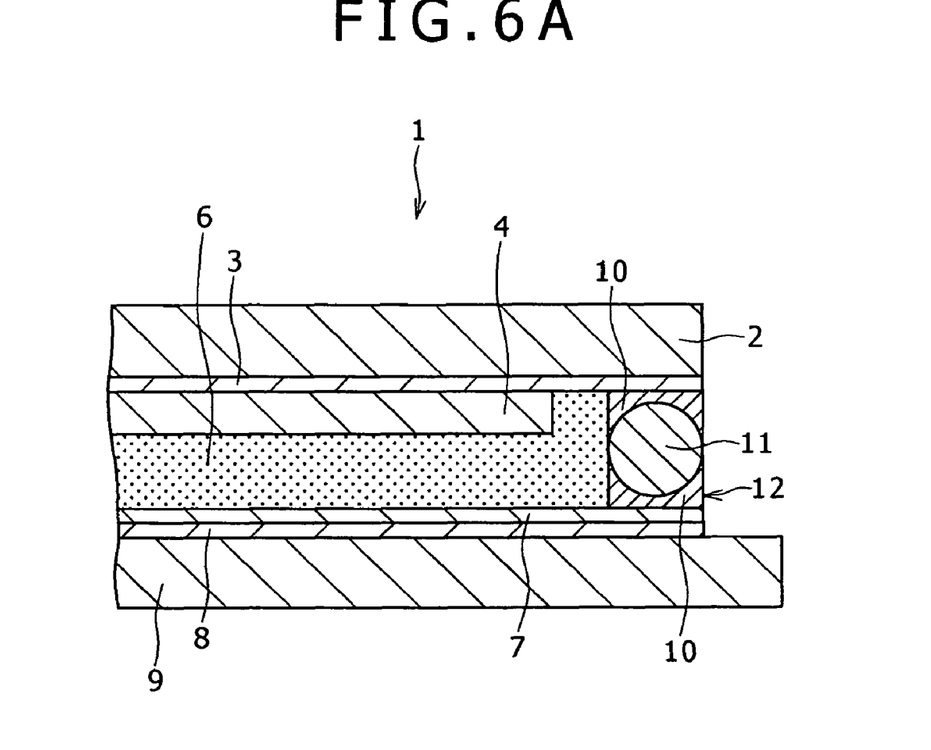
FIGS. 6A and 6B are partial cross-sectional views of wet devices according to other embodiments.

Alternatively, an enclosure structure may be formed at the outer peripheries 12 of the substrates 2 and 9 in the following manner (FIG. 6A). Initially, encapsulants 10 and 10 are attached to outer peripheries 12 of the substrates 2 and 9, respectively. A spacer 11 having a rectangular frame shape with a round cross section is arranged between the encapsulant 10 on the substrate 2 and the encapsulant 10 on the substrate 9. A pressure is then vertically applied to the substrates 2 and 9 from outside toward inside to yield an enclosure structure at the outer peripheries 12 of the substrates 2 and 9. The enclosure structure has an integrated three-layer structure and includes the spacer 11 having a round cross section, and the encapsulants 10 and 10 arranged so as to sandwich the spacer 11.

Figure 6B:
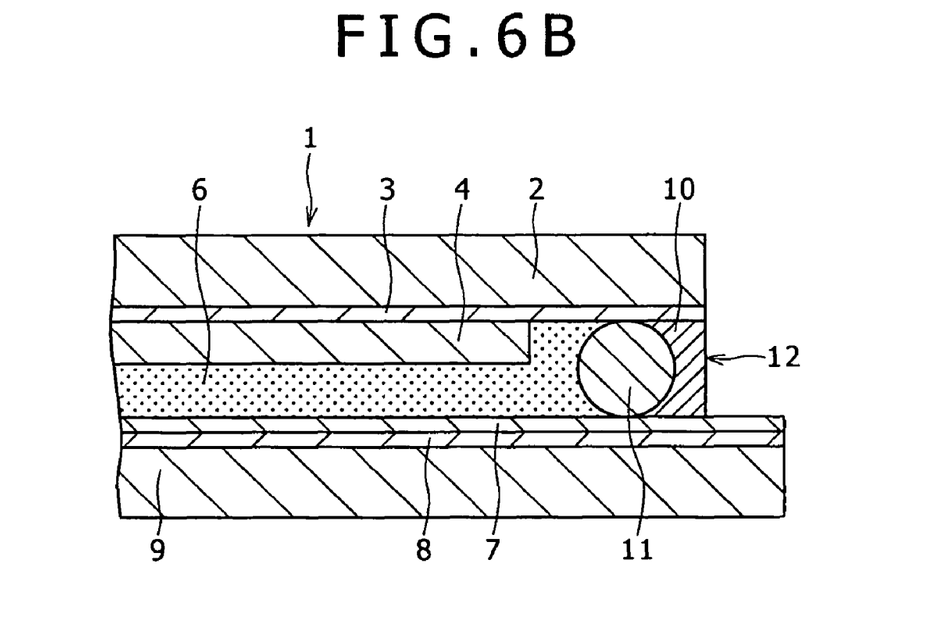

With reference to FIG. 6B, yet another enclosure structure may be prepared in the following manner. Initially, a spacer 11 having a round cross section is placed between substrates 2 and 9 at an outer periphery 12 of the substrates 2 and 9. An encapsulant 10 is arranged on an exposed outer side of the round spacer 11 so as to fill or bridge a space between the substrate 2 and the substrate 9. Thus, an enclosure structure is formed at the outer periphery of the substrates 2 and 9. The resulting enclosure structure integrally includes the spacer 11 having a round cross section, and the encapsulant 10 arranged on the side of the spacer 11.

A wet device 1 can be prepared by any process not specifically limited. For example, when the electrolyte composition is liquid or when it is liquid and is capable of gelatinizing after introduced into the wet device 1, the wet device 1 may be prepared in the following manner. A counter electrode 7 and a semiconductor electrode 4 carrying a dye are placed so as to face each other. Next, an outer periphery 12 of substrates 2 and 9 where the fine semiconductor particle layer 4 (semiconductor electrode 4) is not arranged is sealed so as to avoid contact between the two electrodes 4 and 7.

The gap between the semiconductor electrode 4 and the counter electrode 7 is not specifically limited, but is generally about 1 to about 100 µm, and more preferably about 1 to about 50 µm. If the gap between the electrodes 4 and 7 is excessively large, a photoelectric current decreases due to decreased conductivity.

The sealing process is not specifically limited. A sealing material is preferably one having weather resistance, insulating property, and moisture barrier property. Various welding processes, as well as epoxy resins, ultraviolet-curable resins, acrylic adhesives, ethylene vinyl acetate (EVA), ionomer resins, ceramics, modified polyethylenes or modified polypropylenes, and thermally adhesive materials can be used.

A filling port for charging a solution of the electrolyte composition into between the semiconductor electrode 4 and the counter electrode 7 may be arranged. It can be provided at any position other than a portion on the semiconductor layer 4 bearing a dye, and a corresponding portion of the counter electrode 7.

The solution can be charged by any process not specifically limited but is preferably charged into the wet device 1 through a filling port after the outer periphery 12 of the substrates 2 and 9 is sealed. The filling port has been previously formed. In this case, a process of dropping a few drops of the solution to the filling port and charging the solution as a result of a capillary phenomenon is easy and convenient. The charging procedure can be carried out under reduced pressure or with heating, where necessary.

After the completion of charging the solution, the solution remained at the filling port is removed, and the filling port is end-sealed. The end-sealing process is not specifically limited, and where necessary, the end-sealing can be carried out by applying a base such as a glass plate or a plastic base with a sealing agent to the filling port. In this procedure, the base should be prevented from extending outward from the substrates 2 and 9.

When a gel electrolyte composition typically containing a polymer or a solid-state electrolyte composition is used, the charging and end-sealing may be conducted in the following manner. A polymer solution containing the electrolyte composition and a plasticizer is cast on the semiconductor electrode 4 bearing a dye, followed by evaporation. After fully removing the plasticizer by evaporation, end-sealing may be conducted according to the above-mentioned procedure.

The end-sealing herein is preferably carried out in an inert gas atmosphere or under reduced pressure typically using a vacuum sealer. If necessary, a heating and/or pressurizing procedure can be carried out after the end-sealing, so as to impregnate the fine semiconductor particle layer 4 with the electrolyte composition sufficiently.

EXAMPLES

Some embodiments according to the present invention will be illustrated with reference to several examples and comparative examples below. It should be noted, however, that these are shown only by example and are never intended to limit the scope of the present invention.

Wet devices herein were prepared in the following manner.

Example 1

A film of a titanium dioxide ($TiO_2$) paste was applied to a transparent electroconductive glass substrate 2 by blade coating to an area of 5-mm square so as to ensure a gap of 200 μm. The applied film was held to 500° C. for thirty minutes to thereby sinter $TiO_2$ on the electroconductive glass. The resulting $TiO_2$ film had a thickness of 15 μm. The $TiO_2$ paste was Ti—Nanoxide T (the product of Solaronix SA), and the transparent electroconductive glass substrate 2 was made from fluorine-doped tin oxide (FTO; fluorine-doped $SnO_2$).

Next, the sintered titanium dioxide ($TiO_2$) film was held in a 0.05 M aqueous titanium tetrachloride ($TiCl_4$) solution at 70° C. for thirty minutes, was washed, and was fired again at 500° C. for thirty minutes.

After removing impurities, the sintered $TiO_2$ layer was exposed to ultraviolet rays for thirty minutes using an ultraviolet irradiator.

Next, a dye was supported by the sintered $TiO_2$ layer by immersing the sintered $TiO_2$ layer in a 0.3 mM solution of cis-bis(isothiocyanato)-N,N-bis(2,2'-dipyridyl-4,4'-dicarb oxylato)-ruthenium (II) ditetrabutylammonium salt in a 1:1 (by volume) mixture of tert-butyl alcohol and acetonitrile at room temperature for twenty-four hours. The resulting dye-bearing sintered $TiO_2$ electrode 4 was sequentially washed with an acetonitrile solution of 4-tert-butyl pyridine and acetonitrile and was dried in a dark place.

A metal layer 7 serving as a counter electrode was prepared by sequentially carrying out sputtering of chromium to a thickness of 500 angstroms and sputtering of platinum to a thickness of 1000 angstroms onto a fluorine-doped tin oxide (FTO) layer 8 having a previously-formed filling port 0.5 mm in diameter, applying a solution of chloroplatinic acid in isopropyl alcohol thereto by spray coating, and heating the resulting article at 385° C. for fifteen minutes.

The above-prepared dye-sensitized fine semiconductor particle electrode 4 and the counter electrode 7 were placed so as to face each other. An encapsulant 10 including an ultraviolet-curable acrylic resin was applied to a thickness of 5 μm to both sides of a frame-shaped glass spacer 11 having a width of 5 mm and a thickness of 50 μm, and this was placed between the two substrates 2 and 9, and the resin was cured using an ultraviolet irradiator. Thus, a blank cell was prepared.

An electrolyte composition was prepared by dissolving 0.1 mole per liter of sodium iodide (NaI), 1.4 mole per liter of 1-propyl-2,3-dimethylimidazolium iodide (DMPImI), 0.15 mole per liter of iodine ($I_2$), and 0.2 mole per liter of 4-tert-butylpyridine (TBP) in 2 g of methoxypropionitrile (MPM).

Next, the electrolyte composition was charged into the above-prepared blank cell through the filling port using a delivery pump, and the pressure was reduced to remove inside bubbles.

The filling port was then end-sealed with an acrylic resin or a glass base and thereby yielded a wet device 1.

Example 2

A wet device was prepared by the procedure of Example 1, except for using an alumina spacer 11 as an insulating spacer.

Example 3

A wet device was prepared by the procedure of Example 1, except for using a quartz spacer 11 as an insulating spacer, and applying a glass frit as an encapsulant 10 to both sides of the quartz spacer 11.

Comparative Example 1

A wet device was prepared by the procedure of Example 1, except for using no insulating spacer 11, and encapsulating the cell with an encapsulant 10 including an ionomer resin and having a thickness of 50 μm alone.

Comparative Example 2

A wet device was prepared by the procedure of Example 1, except for using no insulating spacer 11 and encapsulating the cell with an encapsulant 10 including an ultraviolet-curable acrylic resin alone.

These examples and comparative examples are shown in Table 1 below.

TABLE 1

| | Insulating spacer | Thickness of insulating spacer | Encapsulant | Thickness of encapsulant |
|---|---|---|---|---|
| Example 1 | Glass | 50 μm | Acrylic resin | 5 μm |
| Example 2 | Alumina | 50 μm | Acrylic resin | 5 μm |
| Example 3 | Quartz | 50 μm | Glass frit | 5 μm |
| Com. Ex. 1 | None | — | Ionomer resin | 50 μm |
| Com. Ex. 2 | None | — | Acrylic resin | 50 μm |

The wet devices prepared according to Examples 1 to 3 and Comparative Examples 1 and 2 were exposed to an artificial solar light (AM 1.5, 100 mW/cm$^2$), and photoelectric conversion efficiencies of the wet devices were measured every ten days.

Figure 7:
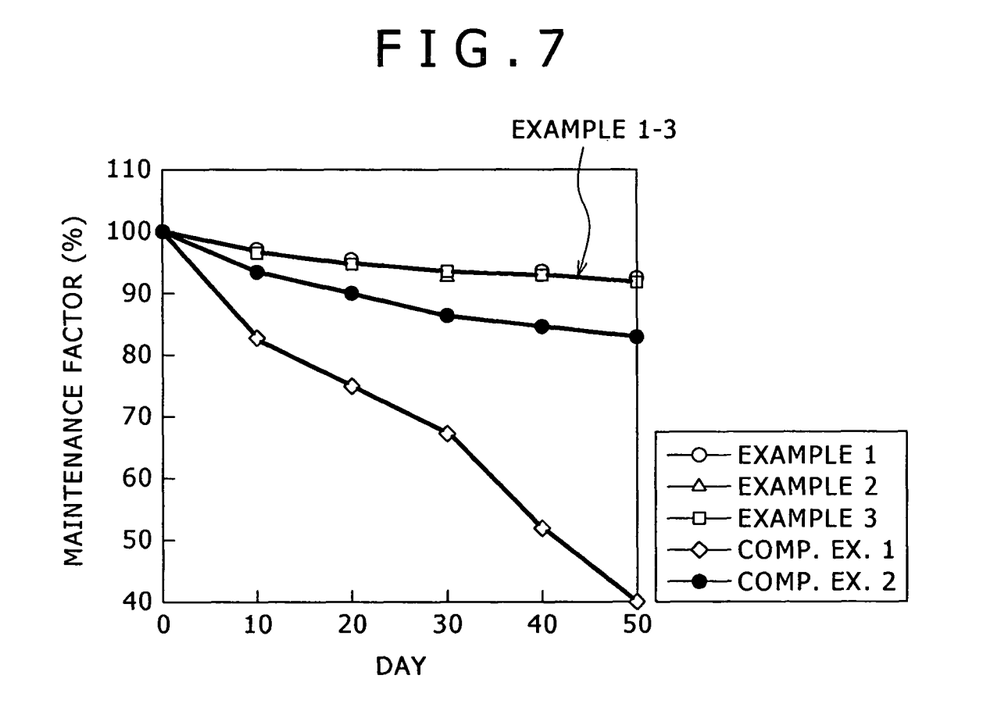
FIG. 7 is a graph showing maintenance factors in photoelectric conversion efficiency of wet devices prepared according to Examples mentioned below.

The determined maintenance factors (%) in photoelectric conversion efficiency are shown in FIG. 7, in which the photoelectric conversion efficiencies measured on Day one were set at 100%, respectively. FIG. 7 demonstrates that the wet devices according to Examples 1 to 3 each showed a gradually decreasing maintenance factor but kept a maintenance factor of 90% or more even on the fiftieth day of irradiation. In contrast, the wet device according to Comparative Example 1 showed a maintenance factor of about 40% on the fiftieth day of irradiation, and the wet device according to Comparative Example 2 showed a maintenance factor of about 80% on the fiftieth day of irradiation.

Separately, the wet devices prepared according to Examples 1 to 3 and Comparative Examples 1 and 2 were stored in a thermostatic chamber at 80° C., and the weights of the wet devices were measured every ten days.

Figure 8:
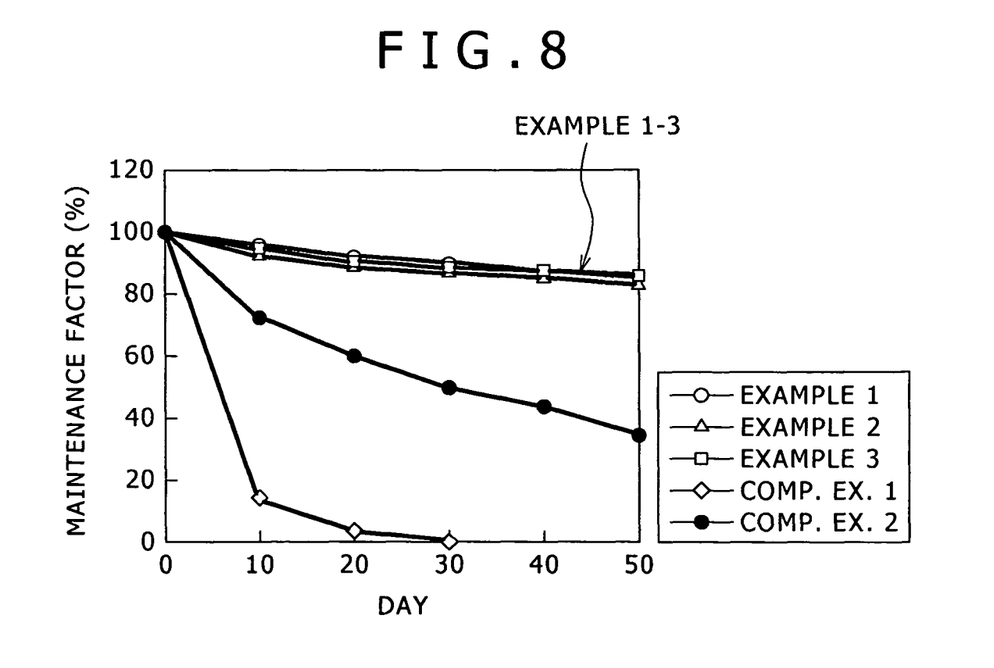
FIG. 8 is a graph showing maintenance factors in weight of the wet devices.

The determined maintenance factors (%) in weight are shown in FIG. 8, in which the weights measured on Day one were set at 100%, respectively. FIG. 8 demonstrates that the wet devices according to Examples 1 to 3 each showed gradually decreasing maintenance factor in weight but kept a maintenance factor of 80% or more even on the fiftieth day of storage. In contrast, the wet device according to Comparative Example 1 showed a maintenance factor of about 0% on the fiftieth day of storage, and the wet device according to Comparative Example 2 showed a maintenance factor of about 30% on the fiftieth day of storage.

These results demonstrate that the wet devices according to Examples 1 to 3 can maintain higher maintenance factors with time than the wet devices according to Comparative Examples 1 and 2, and that the wet devices according to Examples 1 to 3 are encapsulated highly satisfactorily and are capable of maintaining their photoelectric conversion efficiencies and weights even upon irradiation with light and storage at high temperatures.

Having described the present invention as related to some embodiments and examples, it should be noted that the present invention be not limited by any of the details of description, unless otherwise specified, and that various changes and modifications may be made in the invention without departing from the spirit and scope thereof.

For example, a wet device 1 according to an embodiment can have a various shapes according to its use, and the shape and configuration (structure) thereof are not specifically limited.

A plural plies of spacers 11 can be arranged in vertical or horizontal direction. The spacers 11 may have any sectional shape such as a rectangular, round, triangular, or polygonal shape.

A device according to an embodiment can be applied not only to solar cells but also typically to liquid crystal display devices, organic and inorganic electroluminescent devices, and electrochemical cells.

A functional device according to an embodiment is useful typically as a wet solar cell. The resulting solar cell may be satisfactorily encapsulated and maintains a high efficiency over a long period of time.

It should be understood by those skilled in the art that various modifications, combinations, subcombinations, and alterations may occur depending on design requirements and other factors insofar as they are within the scope of the appended claims or the equivalents thereof.

What is claimed is:

1. A functional device comprising:
   a plurality of substrates;
   an electrode arranged on a first substrate of the plurality of substrates and a counter electrode arranged opposite to the electrode on a second substrate of the plurality of substrates; and
   at least one enclosure structure arranged between the first substrate and the second substrate, wherein the at least one enclosure structure has a rectangular frame shape, wherein:
   the at least one enclosure structure comprises at least three layers including a first encapsulant, a spacer, and a second encapsulant arranged vertically in this order,
   in a first cross-section of the functional device, each of the first substrate of the plurality of substrates and the second substrate of the plurality of substrates directly bonds with two first separate portions of the at least one enclosure structure,
   in a second cross-section of the functional device that is perpendicular to the first cross-section, each of the first substrate and the second substrate is separated from the at least one enclosure structure at two second separate portions of the at least one enclosure structure by at least one layer different from the at least one enclosure structure,
   the spacer has a thickness that is equal to or less than a total thickness of the electrode and the counter electrode,
   the functional device comprises a functional material arranged between the plurality of substrates and encapsulated with the at least one enclosure structure, wherein the functional material comprises a liquid composition, and
   the spacer is inert to a solvent constituting the liquid composition and acts as a barrier to the solvent.

2. The functional device according to claim 1, wherein the spacer comprises at least one material selected from inorganic materials, including glass, quartz, alumina, and zirconia, and organic materials, including polyethylenes, polypropylenes, poly(ethylene terephthalate)s, poly(ethylene naphthalate)s, poly(phenylene sulfide)s, and polyimides.

3. The functional device according to claim 1, wherein the first encapsulant and the second encapsulant comprise at least one material selected from a group consisting of acrylic resins, epoxy resins, polyisobutylenes, urethane resins, silicone resins, ionomer resins, polyolefins, and glass frits.

4. The functional device according to claim 1,
   wherein the electrode and the counter electrode extend to edges of the plurality of substrates, respectively, and
   wherein edges of the electrode and the counter electrode overlap each other at least partially so as to sandwich the at least one enclosure structure.

5. The functional device according to claim 1, wherein the functional material comprises a liquid electrolyte composition, and wherein outer peripheries of the plurality of substrates are sealed.

6. The functional device according to claim 5, wherein the functional device comprises a dye-sensitized solar cell.

7. The functional device according to claim 1, wherein at least one of the first encapsulant and the second encapsulant is formed on a transparent conductive layer.

8. The functional device according to claim 7, wherein a surface electrical resistance of the transparent conductive layer is equal to or less than 500 $\Omega/cm^2$.

9. The functional device according to claim 1, wherein the spacer has a thickness that is equal to or less than a total thickness of a plurality of electrodes, wherein each electrode from the plurality of electrodes extends to an edge of a substrate from the plurality of substrates.

10. The functional device according to claim 1, wherein the spacer has a rectangular cross-section.

11. The functional device according to claim 1, wherein the electrode comprises a semiconductor particles layer and the counter electrode comprises a metal layer.

12. The functional device according to claim 11, wherein the semiconductor particles layer comprises a plurality of particles of a first average diameter and a plurality of particles of a second average diameter, wherein the second average diameter is greater than the first average diameter.

13. The functional device according to claim 11, wherein a surface area of the semiconductor particles layer is about 1000 times greater than a projected area of the semiconductor particles layer.

14. The functional device according to claim 1, wherein at least one of the first encapsulant and the second encapsulant has a thickness between 0.1 μm and 50 μm.

15. A functional device, comprising: a plurality of substrates; an electrode arranged on a first substrate of the plurality of substrates and a counter electrode arranged opposite to the electrode on a second substrate of the plurality of substrates; and
   at least one enclosure structure arranged between the first substrate and the second substrate, wherein the at least one enclosure structure has a rectangular frame shape, wherein:
   the at least one enclosure structure comprises at least three layers including a first encapsulant, a spacer, and a second encapsulant arranged vertically in this order,
   in a first cross-section of the functional device, each of the first substrate of the plurality of substrates and the second substrate of the plurality of substrates directly bonds with at-least two first separate portions of the at least one enclosure structure,
   in a second cross-section of the functional device that is perpendicular to the first cross-section, each of the first substrate and the second substrate is separated from the at least one enclosure structure at two second separate portions of the at least one enclosure structure by at least one layer different from the at least one enclosure structure,
   the spacer has a thickness that is equal to or less than a total thickness of the electrode and the counter electrode,
   the functional device comprises a functional material arranged between the plurality of substrates and encapsulated with the at least one enclosure structure, wherein the functional material comprises a liquid composition, and
   the spacer is inert to a solvent constituting the liquid composition and acts as a barrier to the solvent.

16. The functional device according to claim 15, wherein the electrode comprises a semiconductor particles layer comprising a plurality of particles of a first average diameter and a plurality of particles of a second average diameter, wherein the second average diameter is greater than the first average diameter.

17. The functional device according to claim 15, wherein at least one of the first encapsulant and the second encapsulant has a thickness between 0.1 μm and 50 μm.

18. The functional device according to claim 15, wherein the electrode comprises a semiconductor particles layer, and wherein a surface area of the semiconductor particles layer is about 1000 times greater than a projected area of the semiconductor particles layer.

* * * * *